(12) United States Patent
Tanaka

(10) Patent No.: US 9,676,662 B2
(45) Date of Patent: Jun. 13, 2017

(54) SUPPORTED RESIN SUBSTRATE AND METHOD FOR PRODUCING THE SAME AND ELECTRONIC DEVICE IN WHICH THE SUPPORTED RESIN SUBSTRATE IS USED

(71) Applicant: Panasonic Intellectual Property Management Co., Ltd., Osaka (JP)

(72) Inventor: Yuji Tanaka, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 90 days.

(21) Appl. No.: 14/719,635

(22) Filed: May 22, 2015

(65) Prior Publication Data

US 2015/0344361 A1   Dec. 3, 2015

(30) Foreign Application Priority Data

May 29, 2014 (JP) .................. 2014-111328

(51) Int. Cl.
  *C03C 17/42* (2006.01)
  *H01L 21/00* (2006.01)
  *C23C 14/08* (2006.01)

(52) U.S. Cl.
  CPC ........... *C03C 17/42* (2013.01); *C23C 14/086* (2013.01); *H01L 21/00* (2013.01); *C03C 2218/328* (2013.01); *Y10T 428/31678* (2015.04)

(58) Field of Classification Search
  CPC ................ C03C 17/42; Y10T 428/31678
  See application file for complete search history.

(56) References Cited

U.S. PATENT DOCUMENTS

| | | | | |
|---|---|---|---|---|
| 5,230,961 A * | 7/1993 | Tannenbaum | ......... | B05D 5/083 428/331 |
| 5,240,775 A * | 8/1993 | Tannenbaum | ......... | B05D 5/083 427/385.5 |
| 5,725,981 A * | 3/1998 | Kato | ............. | G03G 5/147 430/125.31 |
| 5,741,601 A * | 4/1998 | Kishida | ............ | C08J 5/18 264/176.1 |
| 6,316,589 B1 * | 11/2001 | You | ............ | C08G 73/10 264/235 |
| 8,247,142 B1 * | 8/2012 | Cote | ............. | C08G 65/007 427/372.2 |
| 2002/0130441 A1 * | 9/2002 | Robinson | ............. | B06B 3/02 264/442 |
| 2003/0050407 A1 * | 3/2003 | Tajiri | ............. | C08G 73/1039 525/420 |
| 2004/0234686 A1 * | 11/2004 | Tajiri | ............. | C08G 73/1039 427/240 |
| 2007/0041699 A1 * | 2/2007 | Makino | ............. | B01D 71/64 385/141 |
| 2007/0091062 A1 * | 4/2007 | French | ............. | G02F 1/133305 345/107 |
| 2007/0184254 A1 * | 8/2007 | Matsuno | ............. | B05D 7/54 428/215 |
| 2008/0285144 A1 * | 11/2008 | Oshima | ............. | G02B 3/14 359/666 |
| 2008/0305620 A1 * | 12/2008 | Hyun | ............. | H01L 21/28202 438/514 |
| 2011/0003118 A1 * | 1/2011 | Ohtsu | ............. | C08G 73/1039 428/141 |
| 2011/0081500 A1 * | 4/2011 | Zhao | ............. | H01L 21/76801 427/535 |
| 2011/0081503 A1 * | 4/2011 | Zhao | ............. | H01L 21/0212 427/577 |
| 2012/0228602 A1 * | 9/2012 | Nakatani | ............. | H01L 51/5088 257/40 |
| 2013/0266803 A1 * | 10/2013 | Dooley | ............. | B32B 27/28 428/339 |
| 2014/0045108 A1 * | 2/2014 | Vella | ............. | G03G 5/0539 430/56 |
| 2014/0127902 A1 * | 5/2014 | Zhao | ............. | H01L 21/76843 438/653 |
| 2015/0147675 A1 * | 5/2015 | Oi | ............. | H01M 8/0206 429/481 |
| 2016/0002407 A1 * | 1/2016 | Wakita | ............. | C08G 73/106 257/40 |

FOREIGN PATENT DOCUMENTS

| | | |
|---|---|---|
| JP | 11-323290 | 11/1999 |
| JP | 2007-512568 | 5/2007 |
| JP | 2007-169304 | 7/2007 |
| JP | 2010-147263 | 7/2010 |
| JP | 2010-260206 | 11/2010 |
| JP | 2013-077521 | 4/2013 |
| WO | 2012/060199 | 5/2012 |

OTHER PUBLICATIONS

Machine translation of WO 2012/060199, 2016.*

* cited by examiner

*Primary Examiner* — Liam J Heincer
(74) *Attorney, Agent, or Firm* — Greenblum & Bernstein, P.L.C.

(57) ABSTRACT

A supported resin substrate comprises a supporting substrate, a release layer arranged on the supporting substrate and containing a metal or a metal oxide, and a resin substrate arranged on the release layer, the resin substrate including a front surface region opposite the release layer and a rear surface region in contact with the release layer. The resin substrate consists essentially of a resin material containing elemental fluorine. The ratio of the compositional proportion of fluorine in the rear surface region of the resin substrate to that in the front surface region of the resin substrate is 0.45 or less.

6 Claims, 6 Drawing Sheets

FIG. 3

| | RELEASE LAYER | ATMOSPHERE FOR FORMATION OF RELEASE LAYER | PEEL STRENGTH [N/20 mm] |
|---|---|---|---|
| EXAMPLE 1 | InZnO | Ar100% | 0.05 |
| EXAMPLE 2 | Al | Ar100% | 0.29 |
| EXAMPLE 3 | AlCu | Ar100% | 0.29 |
| COMPARATIVE EXAMPLE 1 | NONE | — | 0.8 |
| COMPARATIVE EXAMPLE 2 | InZnO | Ar90%/$O_2$10% | 3.6 |
| COMPARATIVE EXAMPLE 3 | $Al_2O_3$ | Ar90%/$O_2$10% | 5.0 |

FIG. 6

| | $\dfrac{\text{(COMPOSITIONAL PROPORTION OF FLUORINE IN REAR SURFACE REGION)}}{\text{(COMPOSITIONAL PROPORTION OF FLUORINE IN FRONT SURFACE REGION)}}$ | $\dfrac{\text{(RELATIVE ABUNDANCE OF C–F BONDS IN REAR SURFACE REGION)}}{\text{(RELATIVE ABUNDANCE OF C–F BONDS IN FRONT SURFACE REGION)}}$ |
|---|---|---|
| EXAMPLE 1 | 0.41 | 0.35 |
| EXAMPLE 2 | 0.05 | 0.09 |
| EXAMPLE 3 | 0.22 | 0.01 |
| COMPARATIVE EXAMPLE 1 | 0.72 | 0.81 |
| COMPARATIVE EXAMPLE 2 | 0.68 | 0.89 |
| COMPARATIVE EXAMPLE 3 | 0.67 | 0.75 |

SUPPORTED RESIN SUBSTRATE AND METHOD FOR PRODUCING THE SAME AND ELECTRONIC DEVICE IN WHICH THE SUPPORTED RESIN SUBSTRATE IS USED

BACKGROUND

1. Technical Field

The present disclosure relates to a supported resin substrate and a method for manufacturing the same and to an electronic device in which the supported resin substrate is used.

2. Description of the Related Art

The widespread use of mobile information terminals and the like in recent years has led to a strong demand for thinner and lighter types of displays and other electronic devices for such terminals and the like. Impact resistance and flexibility have also been in demand in more recent years. For this reason, the use of a flexible resin substrate, instead of the conventional glass substrate, as a substrate to mount an electronic element as a component of an electronic device is now under active research and development. Japanese Unexamined Patent Application Publication (Translation of PCT Application) No. 2007-512568 and Japanese Unexamined Patent Application Publication No. 2007-169304 are examples of related art.

SUMMARY

In one general aspect, the techniques disclosed here feature a supported resin substrate. The supported resin substrate comprises a supporting substrate, a release layer arranged on the supporting substrate and containing a metal or a metal oxide, and a resin substrate arranged on the release layer, the resin substrate including a front surface region opposite the release layer and a rear surface region in contact with the release layer. The resin substrate consists essentially of a resin material containing elemental fluorine. The ratio of the compositional proportion of fluorine in the rear surface region of the resin substrate to the compositional proportion of fluorine in the front surface region of the resin substrate is 0.45 or less.

A supported resin substrate according to an aspect of the present disclosure has a release layer containing a metal or a metal oxide between a supporting substrate and a resin substrate. In addition to this, the ratio of the compositional proportion of fluorine in a rear surface region of the resin substrate, the rear surface region being on the side in contact with the release layer, to that in a front surface region of the resin substrate, the front surface region being on the side opposite the release layer, is 0.45 or less. As a result, the bond strength between the release layer on the supporting substrate and the resin substrate is lower than the bond strength that would be obtained between the supporting substrate and the resin substrate if the resin substrate was disposed directly on the supporting substrate without the release layer.

In a supported resin substrate according to an aspect of the present disclosure, the bond strength between the supporting substrate and the resin substrate is reduced.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3 summarizes the material for the release layers in Examples 1 to 3 and Comparative Examples 1 to 3, along with the atmosphere where these layers were formed and their peel strength;

FIG. 6 summarizes the calculated ratios of the compositional proportion of fluorine in the rear surface region to that in the front surface region of the resin substrates in Examples 1 to 3 and Comparative Examples 1 to 3, along with the calculated ratios of the relative abundance of C—F bonds in the rear surface region to that in the front surface region of the same resin substrates;

DETAILED DESCRIPTION

Figure 1:
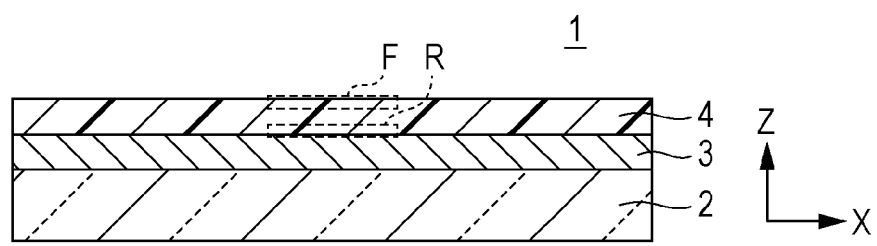
FIG. 1 is a cross-sectional view of a supported resin substrate 1 according to Embodiment 1.

The formation of an electronic element on a resin substrate cannot be performed using a known production process involving a glass substrate because it is difficult to ensure flatness due to the flexibility of the resin substrate.

In order that the known production processes involving a glass substrate can be used, several methods have been studied in which a resin substrate is formed on a rigid supporting substrate such as glass, an electronic element is formed on the resin substrate, and then, at the final stage, the resin substrate with the electronic device formed thereon is peeled off of the supporting substrate.

Examples of resin materials commonly used for resin substrates are polyimides, but resin materials containing elemental fluorine have also been known. Mixing elemental fluorine in a resin material improves the optical transmissivity, moisture-blocking properties, heat resistance, and electrical insulation of the material. In the process of forming a resin substrate containing elemental fluorine on a supporting substrate, forming an electronic element on this resin substrate, and then mechanically separating the resin substrate from the supporting substrate, however, there still remains the problem of high bond strength. Forceful peeling causes defects such as a fracture of the resin substrate or damage to the electronic element.

One non-limiting and exemplary embodiment provides a supported resin substrate free of these defects because of reduced bond strength between the supporting substrate and the resin substrate.

A supported resin substrate according to an aspect of the present disclosure comprises a supporting substrate, a release layer arranged on the supporting substrate and containing a metal or a metal oxide, and a resin substrate arranged on the release layer, the resin substrate including a front surface region opposite the release layer and a rear surface region in contact with the release layer. The resin substrate consists essentially of a resin material containing elemental fluorine. The ratio of the compositional proportion of fluorine in the rear surface region of the resin substrate to the compositional proportion of fluorine in the front surface region of the resin substrate is 0.45 or less. The resin substrate may contain impurities other than the resin material.

In another aspect of the present disclosure, the metal oxide may be at least one selected from the group consisting of indium zinc oxide, zinc oxide, and aluminum oxide.

In another aspect of the present disclosure, the release layer containing the metal oxide may be in an oxygen deficient state.

A method according to an aspect of the present disclosure for producing a supported resin substrate includes providing a supporting substrate, forming a release layer containing a metal or a metal oxide on the supporting substrate, and applying a resin material to the release layer to form a resin substrate including a front surface region opposite the release layer and a rear surface region in contact with the release layer. The resin material contains elemental fluorine. The ratio of the compositional proportion of fluorine in the rear surface region of the resin substrate to the compositional proportion of fluorine in the front surface region of the resin substrate is 0.45 or less.

In another aspect of the present disclosure, the metal oxide may be at least one selected from the group consisting of indium zinc oxide, zinc oxide, and aluminum oxide.

In another aspect of the present disclosure, the release layer containing the metal oxide may be formed in an inert gas or a reducing gas.

A method according to another aspect of the present disclosure may include forming an electronic element on a supported resin substrate produced using any of the above production methods and mechanically peeling the resin substrate with the electronic element formed thereon from the release layer formed on the supporting substrate.

An electronic device according to an aspect of the present disclosure has a resin substrate including a front surface region and a rear surface region opposite the front surface region, and an electronic element in contact with the front surface region of the resin substrate. The resin substrate consists essentially of a resin material containing elemental fluorine. The ratio of the compositional proportion of fluorine in the rear surface region of the resin substrate to the compositional proportion of fluorine in the front surface region of the resin substrate is 0.45 or less.

In another aspect of the present disclosure, the electronic element may be an organic electroluminescent element.

In the foregoing aspects of the present disclosure, the compositional proportion of fluorine in the front surface region may be the proportion of the amount of elemental fluorine to the total amount of all detected elements obtained by X-ray photoelectron spectroscopy of the front surface region, and the compositional proportion of fluorine in the rear surface region may be the proportion of the amount of elemental fluorine to the total amount of all detected elements obtained by X-ray photoelectron spectroscopy of the rear surface region.

A supported resin substrate according to an aspect of the present disclosure comprises a supporting substrate, a release layer arranged on the supporting substrate and containing a metal or a metal oxide, and a resin substrate arranged on the release layer, the resin substrate including a front surface region opposite the release layer and a rear surface region in contact with the release layer. The resin substrate consists essentially of a resin material having a C—F bond. The ratio of the relative abundance of C—F bonds in the rear surface region of the resin substrate to the relative abundance of C—F bonds in the front surface region of the resin substrate is 0.35 or less. The resin substrate may contain impurities other than the resin material.

A method according to an aspect of the present disclosure for producing a supported resin substrate includes providing a supporting substrate, forming a release layer containing a metal or a metal oxide on the supporting substrate, and applying a resin material to the release layer to form a resin substrate including a front surface region opposite the release layer and a rear surface region in contact with the release layer. The resin material has a C—F bond. The ratio of the relative abundance of C—F bonds in the rear surface region of the resin substrate to the relative abundance of C—F bonds in the front surface region of the resin substrate is 0.35 or less.

A method according to another aspect of the present disclosure may include forming an electronic element on a supported resin substrate produced using any of the above production methods and mechanically peeling the resin substrate with the electronic element formed thereon from the release layer formed on the supporting substrate. In another aspect of the present disclosure, the electronic device, comprising a resin substrate including a front surface region and a rear surface region opposite the front surface region, and an electronic element in contact with the front surface region of the resin substrate, may further meet the following conditions: the resin material for the resin substrate has a C—F bond; and the ratio of the relative abundance of C—F bonds in the rear surface region of the resin substrate to the relative abundance of C—F bonds in the front surface region of the resin substrate is 0.35 or less.

In the foregoing aspects of the present disclosure, the relative abundance of C—F bonds in the front surface region may be the proportion of the area of the spectrum from the C—F bond to the area of the C1s spectrum obtained by X-ray photoelectron spectroscopy of the front surface region, and the relative abundance of the C—F bond in the rear surface region may be the proportion of the area of the spectrum from the C—F bond to the area of the C1s spectrum obtained by X-ray photoelectron spectroscopy of the rear surface region.

The following describes some embodiments of the present disclosure in detail with reference to drawings.

Embodiment 1

(1) Structure of a Supported Resin Substrate

FIG. 1 is a cross-sectional diagram illustrating the structure of a supported resin substrate 1.

The supported resin substrate 1 is composed of a supporting substrate 2, a release layer 3 on it, and a resin substrate 4 on the release layer 3.

Given the fact that the flexible resin substrate 4 is formed above the supporting substrate 2, it is preferred that the supporting substrate 2 be a material that is highly flat and unlikely to deform. Examples of materials that can be used for the supporting substrate 2 include alkali-free glass, soda-lime glass, non-fluorescent glass, phosphate glass, borate glass, and quartz. Acrylic resins, styrene resins, polycarbonate resins, epoxy resins, polyethylene resins, polyester resins, silicone resins, alumina, and similar materials can also be used.

The release layer 3 is formed on the supporting substrate 2. It is preferred that the release layer 3 be made of a material that ensures a decrease in the strength of the bond to the resin substrate 4 to be formed thereon. Such a release layer 3 is made of a material containing a metal or a metal oxide. Examples of metals include aluminum, zinc, magnesium, indium, copper, aluminum-copper alloys, aluminum-manganese alloys, and aluminum-magnesium alloys. Examples of metal oxides include indium zinc oxide, zinc oxide, aluminum oxide, indium oxide, magnesium oxide, copper oxide, lithium oxide, potassium oxide, sodium oxide, and calcium oxide.

The resin substrate 4 is formed on the release layer 3. The resin substrate 4 is made of a resin material containing elemental fluorine, and such materials include resin materials having a C—F bond (carbon-fluorine bond) as part of their substituents. An example of this type of resin material is polyimide. The resin substrate 4 has a rear surface region R on the side in contact with the release layer 3, and a front surface region F on the other side. The ratio of the compositional proportion of fluorine in the rear surface region R to that in the front surface region F is 0.45 or less. Now to make the ratio of the compositional proportion of fluorine in the rear surface region R to that in the front surface region F 0.45 or less is described in detail hereinafter. Compositional proportions of fluorine are herein mentioned on the premise that they are measured using XPS (X-ray photoelectron spectroscopy). The front surface region F and the rear surface region R therefore represent regions from the respective outermost surfaces to a depth of some nanometers to approximately 10 nm. Besides polyimides, examples of resin materials that can be used for the resin substrate 4 and have a C—F bond include polyamides, polyimide-imides, polyesters, and polycarbonates. Polymethyl methacrylate, polyurea, polyacetal, polyether ketones, polyether ether ketones, polyether imides, polyarylates and similar materials can also be used. Polyphenylene sulfide, polystyrene, polypropylene, polyethylene, polyvinyl chloride, polyethersulfone, polyethylene naphthalene, and similar materials can also be used. Furthermore, ethylene-propylene copolymers, polyvinylidene chloride, polyethers, and polyphenylene oxide can be used. The resin substrate 4 may be made of a fluorocarbon resin, such as polytetrafluoroethylene or polyvinylidene fluoride. The resin substrate 4 may have a multilayer structure as a combination of two or more of these materials.

(2) Method for Producing the Supported Resin Substrate 1

Figure 2A:
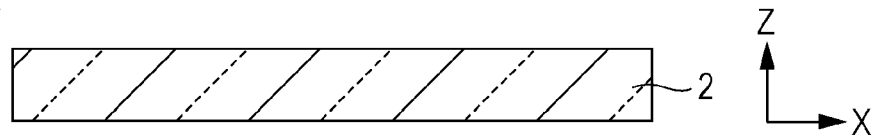
FIG. 2A is a cross-sectional diagram illustrating a state where a supporting substrate 2 has been provided.
Figure 2B:
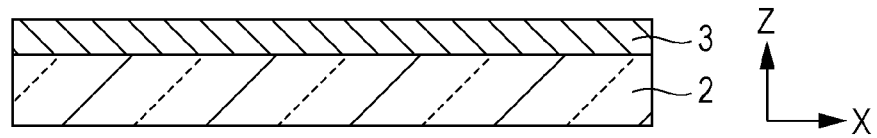
FIG. 2B is a cross-sectional diagram illustrating a state where a release layer 3 has been formed on the supporting substrate 2.
Figure 2C:
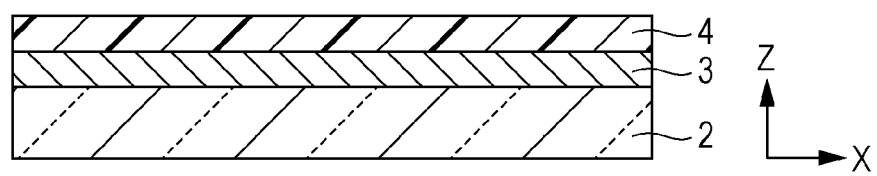
FIG. 2C is a cross-sectional diagram illustrating a state where a resin substrate 4 has been formed on the release layer 3.

FIGS. 2A to 2C are diagrams illustrating a method for producing the supported resin substrate 1.

As illustrated in FIG. 2A, a supporting substrate 2 is provided. Then as illustrated in FIG. 2B, a release layer 3 is formed on the supporting substrate 2. The release layer 3 can be, for example, a layer of a metal or a metal oxide formed through sputtering under a flow of argon gas with the oxygen flow rate being zero. This provides an oxygen-deficient metal oxide. Elemental metals are inherently highly reactive. Forming a resin substrate 4 on the supporting substrate 2 with a metal or an oxygen-deficient metal oxide therebetween reduces the bond strength between the release layer 3 and the resin substrate 4. Finally, as illustrated in FIG. 2C, a resin substrate 4 is formed on the release layer 3. In more specific terms, a solution of a polyamide acid as a precursor of a polyimide having a C—F bond is applied, and then the solvent is dried off through the heating of the formed coating. During this process, the polyamide acid is converted to a polyimide through imidization.

(3) Experimental Results

For the experiments described hereinafter, the following six supported resin substrates (Examples 1 to 3 and Comparative Examples 1 to 3) were prepared.

Example 1

An Eagle XG (a registered trademark of Corning Incorporated) alkali-free glass substrate was prepared as a supporting substrate. On this supporting substrate, a release layer as formed through the DC magnetron sputtering of indium zinc oxide (InZnO) as the target material, having a thickness of 200 nm. The sputtering atmosphere was 100% Ar throughout. Then a solution of the polyamide acid represented by chemical formula 1 in DMAc (dimethylacetamide) was applied to the release layer using spin coating.

Chemical formula 1

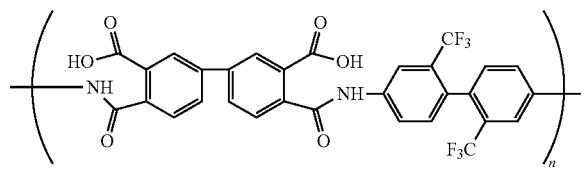

The obtained coating was fired in a nitrogen atmosphere at 400° C. for imidization, forming a polyimide resin substrate having a thickness of 15 μm. In this way, a supported resin substrate of Example 1 was obtained.

Example 2

In Example 2, the release layer was formed through the DC magnetron sputtering of aluminum (Al) as the target material, having a thickness of 200 nm. Except for this, the same method as in Example 1 was used to obtain a supported resin substrate of Example 2.

Example 3

In Example 3, the release layer was formed through the DC magnetron sputtering of an aluminum-copper alloy (AlCu) as the target material, having a thickness of 200 nm. Except for this, the same method as in Example 1 was used to obtain a supported resin substrate of Example 3.

Comparative Example 1

An Eagle XG (a registered trademark of Corning Incorporated) alkali-free glass substrate was prepared as a supporting substrate. Then a solution of the polyamide acid represented by chemical formula 1 in DMAc (dimethylacetamide) was applied directly to the supporting substrate (glass) using spin coating. The obtained coating was fired in a nitrogen atmosphere at 400° C. for imidization, forming a polyimide resin substrate having a thickness of 15 μm. In this way, a supported resin substrate of Comparative Example 1 was obtained.

Comparative Example 2

An Eagle XG (a registered trademark of Corning Incorporated) alkali-free glass substrate was prepared as a supporting substrate. On this supporting substrate, a release layer was formed through the DC magnetron sputtering of indium zinc oxide (InZnO) as the target material, having a thickness of 200 nm. The sputtering atmosphere was 90% Ar/10% $O_2$ throughout. Then a solution of the polyamide acid represented by chemical formula 1 in DMAc (dimethylacetamide) was applied to the release layer using spin coating. The obtained coating was fired in a nitrogen atmosphere at 400° C. for imidization, forming a polyimide resin substrate having a thickness of 15 μm. In this way, a supported resin substrate of Comparative Example 2 was obtained.

Comparative Example 3

In Comparative Example 3, the release layer was formed through the reactive DC magnetron sputtering of aluminum (Al) as the target material, having a thickness of 200 nm. The sputtering atmosphere was 90% Ar/10% $O_2$ throughout. As a result, a layer of aluminum oxide ($Al_2O_3$) was formed as a release layer. The compositional proportions of elements in aluminum oxide are not always $Al_2O_3$ and it is more exact to describe aluminum oxide as $Al_xO_y$, where x and y are integers, but herein it is described as $Al_2O_3$. Except for this, the same method as in Comparative Example 1 was used to obtain a supported resin substrate of Comparative Example 3.

Measurement of Peel Strength

A study was performed on the peel strength of the resin substrate of the six supported resin substrates prepared as above. As the peel strength study, a 90° peel test (a test where the substrate was peeled off in the direction perpendicular to it) was conducted in accordance with JIS K6854. FIG. 3 summarizes the results of the measurement of peel strength. The peel strength in Example 1 was significantly low, as low as approximately 1/16 of that in Comparative Example 1, in which no release layer was used. The peel strengths in Examples 2 and 3 were also lower than that in Comparative Example 1, in which no release layer was used. In Comparative Examples 2 and 3, however, despite the use of a release layer, the peel strength was higher than that in Comparative Example 1, in which no release layer was used. The peel strength in Comparative Example 2 was higher than that in Example 1, despite the formation of a release layer from the same target material as in Example 1, indium zinc oxide. The peel strength in Comparative Example 3 was higher than that in Example 2, despite the formation of a release layer from the same target material as in Example 2, aluminum. These results suggest that the conditions under which the release layer is formed are relevant. A difference in the film formation conditions between these examples and comparative examples is the concentration of $O_2$ in the sputtering atmosphere. The sputtering atmosphere in Examples 1 to 3 was 100% Ar, containing no oxygen. The sputtering atmosphere in Comparative Examples 2 and 3 was 90% Ar/10% $O_2$, containing approximately 10% oxygen. Consequently, the release layer in Example 1 can have been deficient in oxygen, whereas the release layers in Comparative Examples 2 and 3 can have been rich in oxygen compared with those in Examples 1 and 2, respectively. The release layers in Examples 2 and 3 were made of elemental metals and, therefore, were not deficient in oxygen. However, elemental metals are highly reactive and thus should be inherently likely to take in oxygen. The fact that the peel strength was low as with the oxygen-deficient metal oxide in Example 1 suggests that in Examples 2 and 3, the state of oxidation of the metal was relevant to the peel strength.

XPS of the Resin Substrate

The resin substrate was peeled off of each of the supported resin substrates of Examples 1 to 3 and Comparative Examples 1 to 3, and XPS was performed to identify the constituting elements and their bonding state in the front surface region (on the side not in contact with the release layer) and the rear surface region (on the side in contact with the release layer or glass) of the removed resin substrates. In general, XPS provides information about the constituting elements of a material and their bonding state in a region from the surface to a depth of some nanometers to approximately 10 nm. The elements of interest in this XPS measurement were C, N, O, and F. H is not detected in XPS. FIG. 6 summarizes the ratios of the compositional proportion of fluorine (F/(C+N+O+F)) in the rear surface region to that in the front surface region.

Figure 4A:
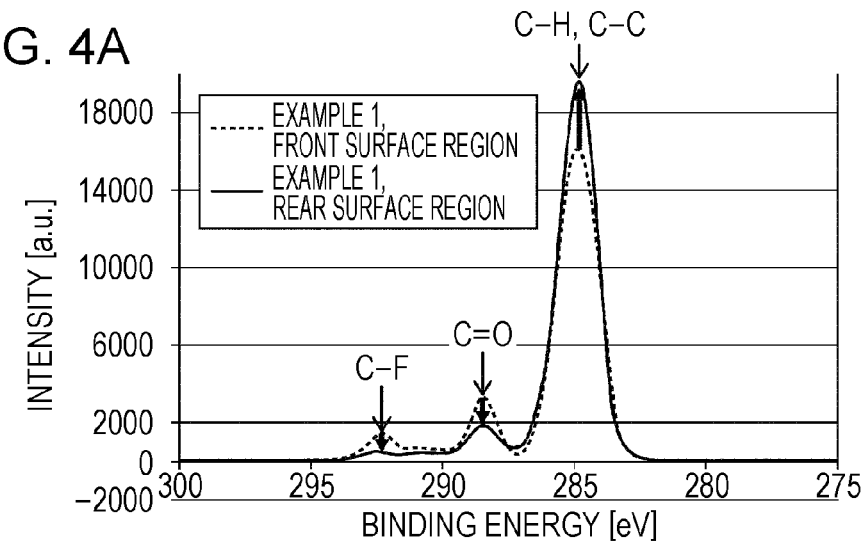
FIG. 4A is a graph illustrating the results of XPS in the front and rear surface regions of the resin substrate in Example 1.
Figure 4B:
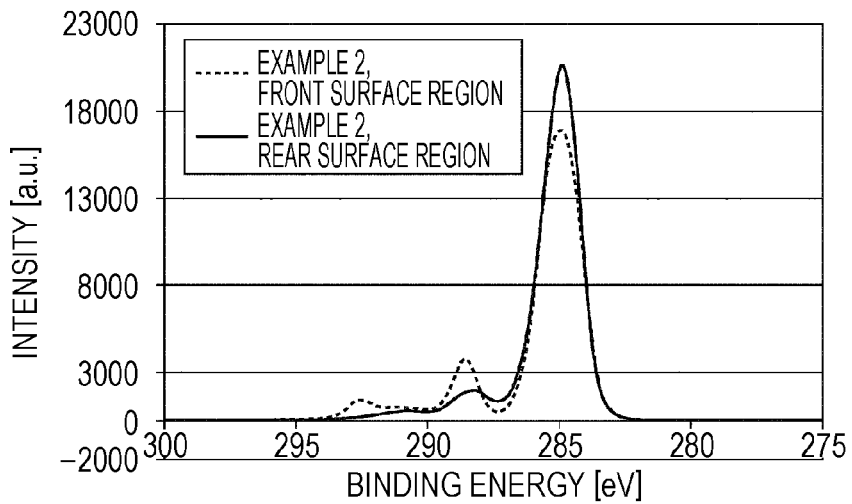
FIG. 4B is a graph illustrating the results of XPS in the front and rear surface regions of the resin substrate in Example 2.
Figure 4C:
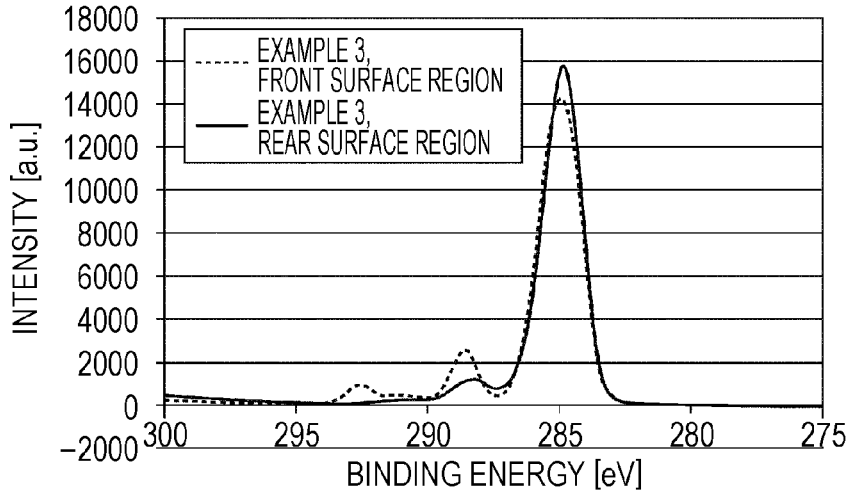
FIG. 4C is a graph illustrating the results of XPS in the front and rear surface regions of the resin substrate in Example 3.
Figure 5A:
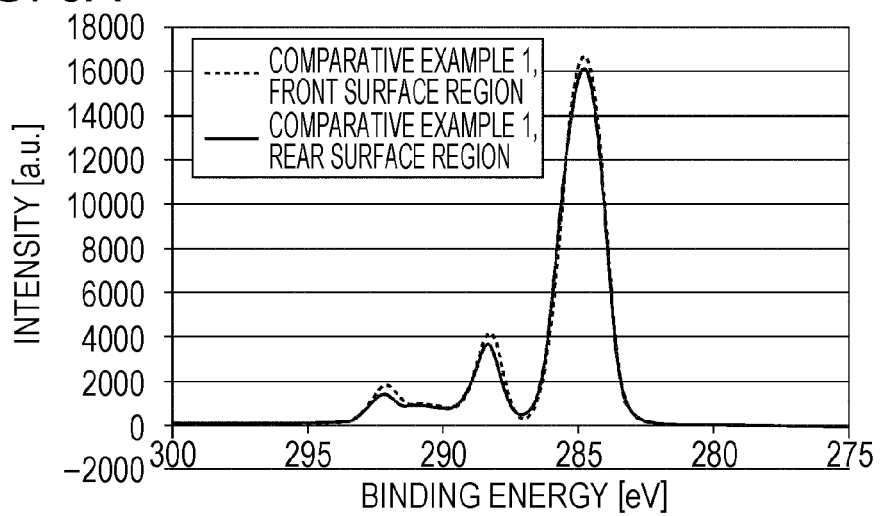
FIG. 5A is a graph illustrating the results of XPS in the front and rear surface regions of the resin substrate in Comparative Example 1.
Figure 5B:
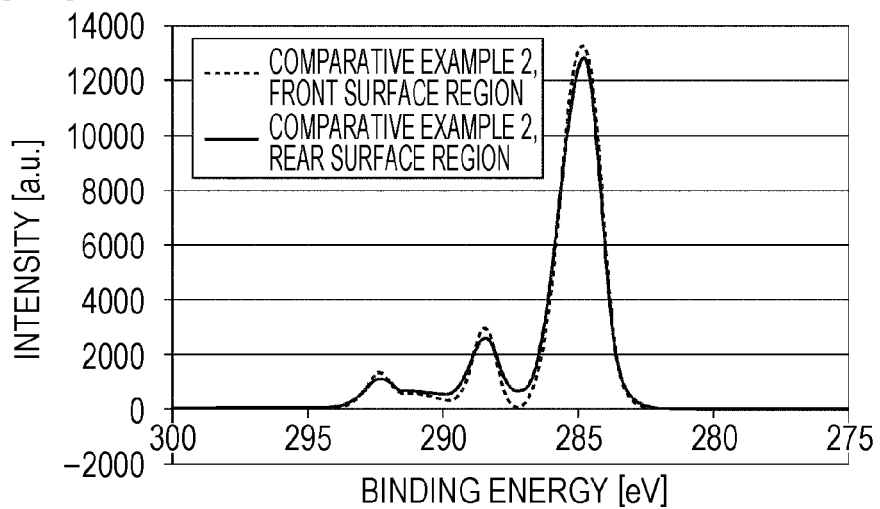
FIG. 5B is a graph illustrating the results of XPS in the front and rear surface regions of the resin substrate in Comparative Example 2.
Figure 5C:
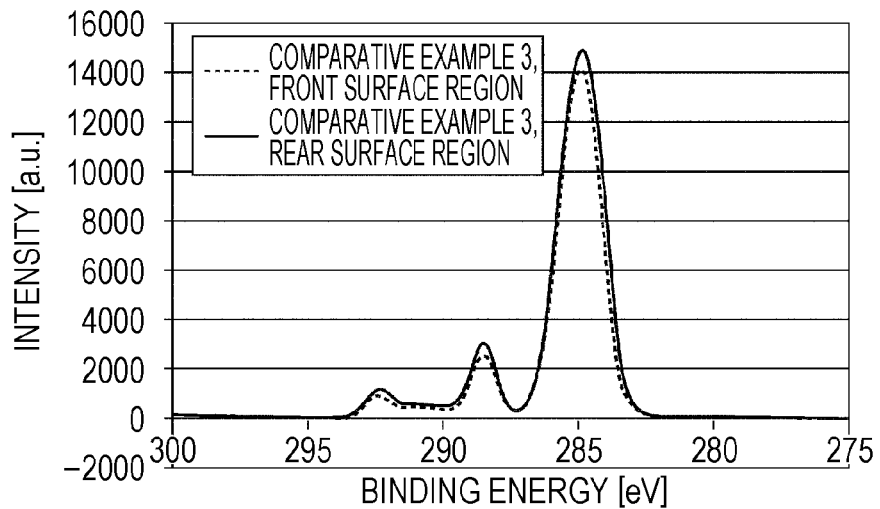
FIG. 5C is a graph illustrating the results of XPS in the front and rear surface regions of the resin substrate in Comparative Example 3.

FIGS. 4A to 4C illustrate the results of the measurement of the C1s narrow-scan spectrum in Examples 1 to 3. FIGS. 5A to 5C illustrate the results of the measurement of the C1s narrow-scan spectrum in Comparative Examples 1 to 3. The spectrum from the C—F bond appears around 292 eV. The spectrum from the C=O bond appears around 288 eV. The peak around 285 eV is mainly attributable to the C—H or C—C bond. As can be seen from FIGS. 5A to 5C, there was little difference in spectrum between the front and rear surface regions in Comparative Examples 1 to 3. In Examples 1 to 3, however, there was a great difference in spectrum between the front and rear surface regions as can be seen from FIGS. 4A to 4C. In more specific terms, the component derived from the C—F bond, around 292 eV, decreased in the rear surface region as compared with the front surface region in all of Examples 1 and 3. The component derived from the C=O bond, around 288 eV, also decreased, whereas the component derived from the C—H (C—C) bond, around 285 eV, increased. In the resin substrates in Examples 1 to 3, the relative decrease in the peak around 288 eV in the rear surface region, which was in contact with the release layer, as compared with the front surface region was greater than the relative increase in the peak around 285 eV. Likewise, the relative decrease in the peak around 292 eV was greater than the relative decrease in the peak around 288 eV. The bond that has the most dominant influence on the peel strength of the resin substrate should therefore be the C—F bond. In light of this, the ratio of the area of the spectral band from the C—F bond (291.0 eV to 294.0 eV), which peaks around 292 eV, to the area of the C1s spectrum (282.0 eV to 294.0 eV) is defined as the relative abundance of C—F bonds. FIG. 6 summarizes the calculated ratios of the relative abundance of C—F bonds in the rear surface region to that in the front surface region.

As can be seen from FIG. 6, both the (compositional proportion of fluorine in rear surface region)/(compositional proportion of fluorine in front surface region) and the (relative abundance of C—F bonds in rear surface region)/(relative abundance of C—F bonds in front surface region) were smaller in Examples 1 to 3 than in Comparative Examples 1 to 3. The decrease in the compositional proportion of fluorine and the relative abundance of C—F bonds in the rear surface region as compared with the front surface region can therefore be correlated with the decrease in the peel strength of the resin substrate.

Discussion

In light of the conditions under which the release layer was formed, the metal oxide in the release layer in Example 1 was deficient in oxygen compared with that in the release layer in Comparative Example 2. The release layers in Examples 2 and 3 were more likely to take in oxygen than the release layer in Comparative Example 3. The results of XPS revealed that in the rear surface region (on the side in contact with the release layer 3) of the resin substrates in Examples 1 to 3, as compared with the front surface region, the number of C—F bonds decreased, while the number of C—H (C—C) bonds increased. This result suggests that C—F bonds were broken and C—H (C—C) bonds were formed. This breakage of C—F bonds in the rear surface region of the resin substrate occurs only when an oxygen-deficient metal oxide is used as a release layer as in Example 1 or when an elemental metal is used as a release layer as in Examples 2 and 3. This phenomenon does not occur when a metal oxide containing an excess of oxygen is used as in Comparative Examples 2 and 3. The following describes a presumptive mechanism of the breakage of C—F bonds that occurs with an oxygen-deficient metal oxide and an elemental metal and a presumptive mechanism of the decrease in bond strength.

In general, the C—F bond is one of the least reactive chemical bonds because of its high bond energy and chemical stability. The breakage of a C—F bond is therefore one of very difficult chemical bond transformations. There are thus few known cases where C—F bonds are broken in an interface between a resin substrate and a metal oxide or a metal as in Embodiment 1. The mechanism of the C—F bond-opening reaction in an interface between an oxygen-deficient metal oxide or an elemental metal and a resin material can be explained by the Lewis acidity or reducing properties of metallic atoms. The following describes these in sequence. Metallic atoms in an oxygen-deficient metal oxide are lacking in oxygen atoms at some of their coordination sites, and such metallic atoms have Lewis acidity (the ability to accept electron pairs). When such a metallic atom (M) is given a valence electron of the fluorine atom in a C—F bond, a metal-fluorine bond is formed via reaction transition states such as C—F-M, and the C—F bond is broken. The mechanism of the breakage of a C—F bond via a reducing reaction caused by the reducing properties of an oxygen-deficient metal oxide or an elemental metal can be as follows. For example, a compound having a C—F bond undergoes one-electron reduction in the presence of a reducing metal atom as in the reaction scheme below (chemical formula 2). If this reaction occurs, the C—F bond is broken via an intermediate radical anion, generating a fluoride anion and a neutral radical. The released fluoride anions diffuse and, for example, form M-F bonds with the metal element contained in the release layer, whereas the neutral radicals, for example, react with a small amount of water contained in the resin material and form C—H bonds.

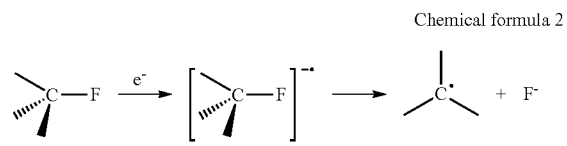

Chemical formula 2

Naturally, this scheme of reaction is only an example. Different substituents next to the C—F bond or different kinds of reducing metals may result in different mechanisms.

The presumed mechanism of the decrease in bond strength is as follows. The fluorine atoms released from the resin material are trapped through the formation of metal-fluorine bonds with metallic atoms contained in the release layer. This results in the metal surface at the bonding interface being covered with fluorine atoms. The inventors have presumed that this reduces electrostatic interactions as a cause of the adhesion between the release layer and the resin material, thereby leading to a decrease in peel strength.

The following describes the quantitative conditions for the (compositional proportion of fluorine in rear surface region)/(compositional proportion of fluorine in front surface region) and the (relative abundance of C—F bonds in rear surface region)/(relative abundance of C—F bonds in front surface region) under which the decrease in peel strength is sufficient. Note that the following discussion assumes that the resin material for the resin substrate can only be a known resin material (in Embodiment 1, polyimide). XPS of the front surface region of the resin substrates in Example 1 and Comparative Example 1 was conducted, with almost completely overlapping spectral shapes (see the broken lines in FIGS. 4A and 5A). This should be because in both cases, the front surface region is an interface with the air and, therefore, has an equivalent surface state. The compositional proportion of fluorine and the relative abundance of C—F bonds in the front surface region of the resin substrate in Example 1 can therefore be deemed to be equal to those in Comparative Example 1. XPS of the front and rear surface regions of the resin substrate in Comparative Example 1 was then conducted. The (compositional proportion of fluorine in rear surface region)/(compositional proportion of fluorine in front surface region) and the (relative abundance of C—F bonds in rear surface region)/(relative abundance of C—F bonds in front surface region) in Comparative Example 1 were then determined, with results as summarized in FIG. 6. That is, the (compositional proportion of fluorine in rear surface region)/(compositional proportion of fluorine in front surface region) was 0.72, and the (relative abundance of C—F bonds in rear surface region)/(relative abundance of C—F bonds in front surface region)

was 0.81. The compositional proportion of fluorine and the relative abundance of C—F bonds in the front surface region of the resin substrate in Example 1 can be deemed to be equal to those in Comparative Example 1. In consequence, the ratio of the compositional proportion of fluorine in the rear surface region of the resin substrates in Embodiment 1 to that in the front surface region of the same resin substrates in Embodiment 1 need to be lower than those in the comparative examples. Likewise, the ratio of the relative abundance of C—F bonds in the rear surface region of the resin substrates in Embodiment 1 to that in the front surface region of the same resin substrates in Embodiment 1 need to be lower than those in the comparative examples. The data from the experiments reported herein (FIG. 6) indicates that a sufficient decrease in peel strength should be obtained if the (compositional proportion of fluorine in rear surface region)/(compositional proportion of fluorine in front surface region) is 0.45 or less, including some margin, because this ratio in Example 1 was 0.41. A condition is therefore that the ratio of the compositional proportion of fluorine in the rear surface region to that in the front surface region is 0.45 or less. Likewise, the data from the experiments reported herein (FIG. 6) indicates that the (relative abundance of C—F bonds in rear surface region)/(relative abundance of C—F bonds in front surface region) should be 0.35 or less because this ratio in Example 1 was 0.35. Another condition is therefore that the ratio of the relative abundance of C—F bonds in the rear surface region to that in the front surface region is 0.35 or less. Meeting these conditions will lead to a reduced peel strength, or bond strength, between the supporting substrate and the resin substrate.

Embodiment 2

This section describes a method for producing an organic EL device as an example of an electronic device in which the supported resin substrate 1 described in Embodiment 1 is used, as well as the structure of the organic EL device, with reference to FIGS. 7A to 7E.

The process of producing the supported resin substrate 1 is as described in Embodiment 1.

Figure 7A:
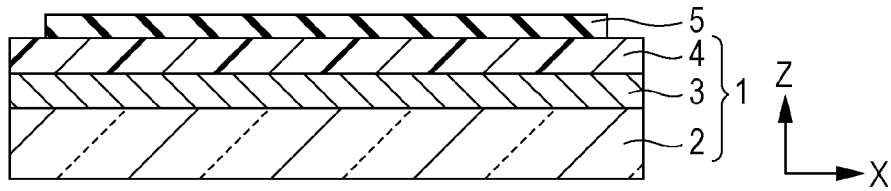
FIG. 7A is a cross-sectional diagram illustrating a state where a barrier layer 5 has been formed on a resin substrate 4 of a supported resin substrate 1.

First, as illustrated in FIG. 7A, a barrier layer 5 is formed on the resin substrate 4 and cut into an appropriate size through patterning. The main role of the barrier layer 5 is to prevent oxygen and water in the air from reaching the organic EL element through the resin substrate 4. The barrier layer 5 also controls the diffusion of water and impurities generated from the resin substrate 4. Examples of materials that can be used for the barrier layer 5 include silicon oxide, silicon nitride, silicon oxide nitride, aluminum oxide, aluminum oxide nitride, and alkylsilane alkoxides. Besides a thin film of one of these materials, an alternating multilayer film containing two or more of these materials can also be used. Examples of methods for forming the barrier layer 5 include CVD, MOCVD, vacuum deposition, sputtering, ALD, MLD, and combinations of these.

Figure 7B:
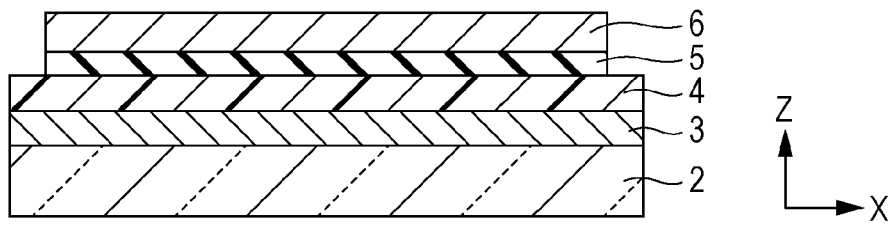
FIG. 7B is a cross-sectional diagram illustrating a state where an organic EL element 6 has been formed on the barrier layer 5.

Then as illustrated in FIG. 7B, an organic EL element 6 is formed on the barrier layer 5. The organic EL element 6 also includes components such as thin-film transistors and electrode wiring. An organic EL layer in the organic EL element 6 is composed of an anode, a light-emitting layer, and a cathode, and may optionally have an electron injection layer, an electron transport layer, or similar.

Figure 7C:
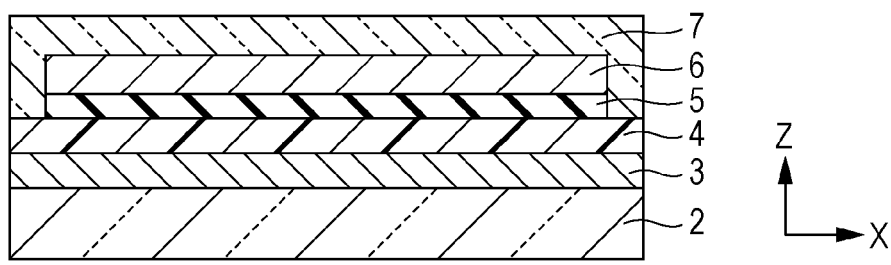
FIG. 7C is a cross-sectional diagram illustrating a state where a sealer 7 has been formed on the resin substrate 4 to cover the barrier layer 5 and the organic EL element 6.

Then as illustrated in FIG. 7C, a sealer 7 is formed on the resin substrate 4 to cover the barrier layer 5 and the organic EL element 6. The sealer 7 reinforces the organic EL device and prevents oxygen and water in the air from reaching the organic EL element 6. It is preferred that the sealer 7 be made of a translucent material that allows visible light to pass through. Examples include polyesters such as polyethylene terephthalate and polyethylene naphthalate, as well as translucent plastic materials such as cyclic polyolefins and polycarbonates. The sealer 7 may optionally have a touchscreen or a circular polarizer. There may be another barrier layer between the sealer 7 and the organic EL element 6. In Embodiment 2, the barrier layer 5, the organic EL element 6, and the sealer 7 make up an electronic element.

Figure 7D:
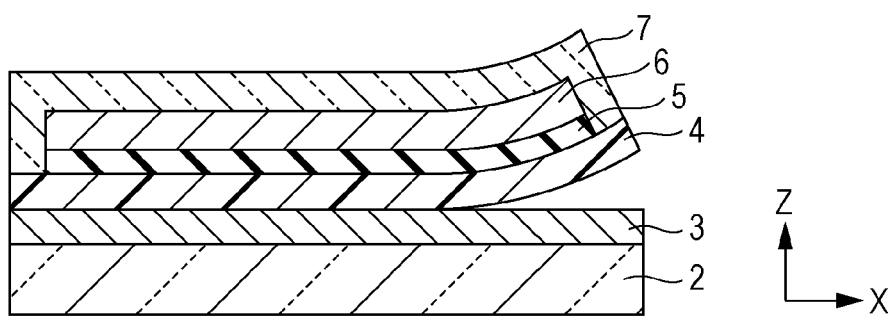
FIG. 7D is a cross-sectional diagram illustrating a state where peeling is in progress between the release layer 3 and the resin substrate 4.

Then as illustrated in FIG. 7D, peeling is performed between the release layer 3 and the resin substrate 4. For example, peeling is performed manually or mechanically using a roller-shaped winder or similar. Since the bond strength between the release layer 3 and the resin substrate 4 is low, the load required to perform peeling does not damage the device.

Figure 7E:
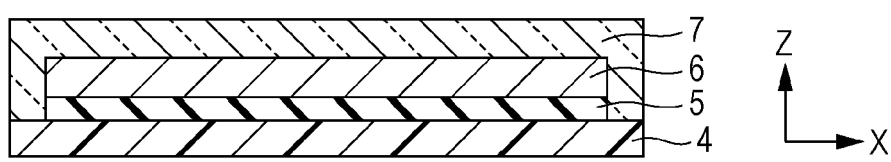
FIG. 7E is a cross-sectional diagram illustrating a state where an organic EL device 101 has been completed.

As a result, as illustrated in FIG. 7E, a flexible organic EL device 101 is completed. Not only being flexible, the organic EL device 101 is also highly visible because it is a self-luminous element. Furthermore, this solid element is remarkably resistant to impact.

Other Information (1) Although the release layer containing a metal oxide on the supporting substrate is formed in a 100% Ar atmosphere in the above embodiments, the atmosphere for the formation of this layer is not limited to Ar. The release layer can be formed in any inert or reducing gas. Examples of inert gases other than Ar include nitrogen and neon. Examples of reducing gases include hydrogen, carbon monoxide, nitrogen monoxide, and sulfur dioxide.

(2) Although an example of an electronic device is an organic EL device having an organic EL element in the above embodiments, the electronic device is not limited to it. Electronic elements that can be used as a component of the electronic device include TFTs (thin-film transistors), liquid crystal display elements, LEDs (light-emitting diodes), electronic paper, touchscreens, solar cells, sensors, LSIs, and ICs.

(3) The structure of a supported resin substrate and a method for producing it, as well as an electronic device in which this resin substrate is used, according to the present disclosure may be a combination of some portions of the structure in the above embodiments chosen as necessary. The materials, numeric values, and other information in the embodiments are for illustration purposes and should not be construed as limitations. The structures can be modified within the scope of the technical idea of the present disclosure as necessary. The present disclosure can be applied to a wide range of supported resin substrates, methods for producing a supported resin substrate, and electronic devices in which a supported resin substrate is used.

The present disclosure can be applied to a wide range of flexible mobile information terminals and the like.

What is claimed is:

1. A method for producing an electronic device, the method comprising:
providing a supporting substrate;
forming a release layer containing a metal or a metal oxide on the supporting substrate; and
applying a resin material to the release layer to form a resin substrate including a front surface region opposite the release layer and a rear surface region in contact with the release layer,
forming an electronic element on the resin substrate; and mechanically peeling the resin substrate with the electronic element formed thereon from the release layer formed on the supporting substrate, wherein the resin material contains elemental fluorine, and a ratio of a compositional proportion of fluorine in the rear surface region of the resin substrate to a compositional proportion of fluorine in the front surface region of the resin substrate is 0.45 or less.

2. The method according to claim 1, wherein the ratio of the compositional proportion of fluorine in the rear surface region of the resin substrate to the compositional proportion of fluorine in the front surface region of the resin substrate is 0.41 or less.

3. An electronic device comprising:

a resin substrate including a front surface region and a rear surface region opposite the front surface region; and an electronic element in contact with the front surface region of the resin substrate, wherein the resin substrate consists essentially of a resin material containing elemental fluorine, a ratio of a compositional proportion of fluorine in the rear surface region of the resin substrate to a compositional proportion of fluorine in the front surface region of the resin substrate is 0.45 or less, and no layer containing a metal or a metal oxide contacts the rear surface region of the resin substrate.

4. The electronic device according to claim 3, wherein the electronic element comprises an organic electroluminescent element.

5. The electronic device according to claim 3, wherein the ratio of the compositional proportion of fluorine in the rear surface region of the resin substrate to the compositional proportion of fluorine in the front surface region of the resin substrate is 0.41 or less.

6. An electronic device comprising:

a resin substrate including a front surface region and a rear surface region opposite the front surface region; and an electronic element in contact with the front surface region of the resin substrate, wherein the resin substrate consists essentially of a resin material having a C—F bond, a ratio of a relative abundance of the C—F bond in the rear surface region of the resin substrate to a relative abundance of the C—F bond in the front surface region of the resin substrate is 0.35 or less, and no layer containing a metal or a metal oxide contacts the rear surface region of the resin substrate.

* * * * *